United States Patent [19]

Liu

[11] Patent Number: 5,393,682
[45] Date of Patent: Feb. 28, 1995

[54] METHOD OF MAKING TAPERED POLY PROFILE FOR TFT DEVICE MANUFACTURING

[75] Inventor: Chwen-Ming Liu, Hsinchu, Taiwan, Prov. of China

[73] Assignee: Taiwan Semiconductor Manufacturing Company, Hsinchu, Taiwan, Prov. of China

[21] Appl. No.: 165,349

[22] Filed: Dec. 13, 1993

[51] Int. Cl.$^6$ .......................................... H01L 21/265
[52] U.S. Cl. ........................................ 437/41; 437/101; 437/909; 437/981; 148/DIG. 127; 148/DIG. 161
[58] Field of Search .................... 437/101, 981, 41, 56, 437/915, 909; 148/DIG. 161, DIG. 127; 156/628

[56] References Cited

U.S. PATENT DOCUMENTS

| | | | |
|---|---|---|---|
| 4,291,321 | 9/1981 | Pfleiderer et al. | 357/23 |
| 4,571,513 | 2/1986 | Lade et al. | 307/577 |
| 4,797,108 | 1/1989 | Crowther | 437/41 |
| 4,839,311 | 6/1989 | Riley et al. . | |
| 5,079,617 | 1/1992 | Yoneda | 357/71 |
| 5,109,258 | 4/1992 | Redwine | 357/23.6 |
| 5,136,355 | 8/1992 | Kerr et al. | 357/41 |
| 5,218,464 | 6/1993 | Hiroki et al. | 359/59 |
| 5,266,515 | 11/1993 | Robb et al. | 437/56 |

FOREIGN PATENT DOCUMENTS 63-62326A 3/1988 Japan ..................... 437/981

OTHER PUBLICATIONS

Wolf et al., "Silicon Processing for the VLSI Era", vol. I, pp. 177–185, 1990.
"A Stacked-CMOS Cell Technology for High Density SRAMs" by Yasuhiro Uemoto et al., IEEE Transistors on Electron Devices, vol. 39, No. 10, Oct. 1992, pp. 2359–2363.

Primary Examiner—George Fourson
Assistant Examiner—Richard A. Booth
Attorney, Agent, or Firm—George O. Saile

[57] ABSTRACT

A new method of forming a tapered polysilicon etching profile in the manufacture of a thin film transistor integrated circuit is described. A layer of polysilicon is deposited over the surface of a semiconductor substrate. Ions are implanted into the polysilicon layer whereby the upper half of the polysilicon layer is damaged by the presence of the ions within the layer. The polysilicon layer is anisotropically etched. The polysilicon layer is isotropically etched whereby the damaged upper portion of the layer is etched faster than is the undamaged lower portion resulting in a tapered polysilicon layer. A layer of gate oxide is deposited over the surface of the tapered polysilicon layer. Then the thin film transistor body is formed. A layer of amorphous silicon is deposited over the surface of the gate oxide layer. The amorphous silicon layer is recrystallized to yield larger grain sizes. Channel and source/drain regions are formed within the recrystallized amorphous silicon layer to complete formation of the thin film transistor body. An insulating layer is deposited over the thin film transistor body and the silicon substrate. Contact openings are made through the insulating layer to the source/drain regions and filled with a conductive material to complete the contacts completing the formation of the thin film transistor integrated circuit.

20 Claims, 2 Drawing Sheets

METHOD OF MAKING TAPERED POLY PROFILE FOR TFT DEVICE MANUFACTURING

BACKGROUND OF THE INVENTION

1. Field of the Invention

The invention relates to a method of manufacturing a thin film transistor (TFT) integrated circuit device, and more particularly, to a method of forming a tapered polysilicon profile in the manufacture of a thin film transistor integrated circuit device.

2. Description of the Prior Art

In the article, "A Stacked-CMOS Cell Technology for High-Density SRAM's,+ by Yasuhiro Uemoto, Eiji Fujii, Akira Nakamura, Kohji Senda, and Hiromitsu Takagi, *IEEE Transactions on Electron Devices*, Vol. 39, No. 10, October 1992, pp. 2359–2363, the authors discuss the use of a polysilicon thin film transistor (TFT). The authors show that the cell area of a stacked-CMOS cell can be greatly decreased by using a thin film transistor load in place of a conventional high resistive load. They describe a process for fabricating a TFT load with as large a polysilicon grain size as possible.

Referring to FIG. 1A, a TFT device is usually formed on an oxide substrate 1 followed by polycrystalline or amorphous silicon 2, CVD silicon oxide 3, and polycrystalline or amorphous silicon 4. A vertical rigid polysilicon etching profile 2 is used as the gate or the source/drain and channel of the bottom part of the TFT which results in a high electric field around the sharp corner 5 and poor CVD oxide quality around the sharp corner 5.

Referring now to FIG. 1B, the same TFT device has a tapered polysilicon etching profile 6 which serves as the gate or the source/drain and channel of the bottom part of the TFT. The smooth profile 6 without the sharp corners allows for a more even electrical field and more even step coverage of the CVD oxide 3.

U.S. Pat. Nos. 5,079,617 to Yoneda, 4,291,321 to Pfleiderer et al, 5,109,258 to Redwine, and 5,136,355 to Kerr et al each show tapered gate structures. All are formed by different means and for different reasons than that of the present invention. For example, Redwine forms his tapered gate by using thermal oxidation to convert to silicon oxide the polysilicon surrounding the masked planned gate area. One method used by Pfleiderer et al uses a silicon dioxide layer under a glasseous layer to form the gate. The glasseous layer is etched more than is the silicon dioxide layer resulting in a tapered profile. The glasseous layer is then melted to round the edges of the tapered profile.

SUMMARY OF THE INVENTION

A principal object of the present invention is to provide an effective and very manufacturable method of forming a tapered polysilicon etching profile in the fabrication of a thin film transistor integrated circuit.

Another object of the present invention is to provide a method of forming a tapered polysilicon etching profile which improves device performance and reliability.

In accordance with the objects of this invention a new method of forming a tapered polysilicon etching profile in the manufacture of a thin film transistor integrated circuit is described. A layer of polysilicon is deposited over the surface of a semiconductor substrate. Ions are implanted into the polysilicon layer whereby the upper half of the polysilicon layer is damaged by the presence of the ions within the layer. The polysilicon layer is anisotropically etched. The polysilicon layer is isotropically etched whereby the damaged upper portion of the layer is etched faster than is the undamaged lower portion resulting in a tapered polysilicon layer.

A layer of gate oxide is deposited over the surface of the tapered polysilicon layer. Then the thin film transistor body is formed. A layer of amorphous silicon is deposited over the surface of the gate oxide layer. The amorphous silicon layer is recrystallized to yield larger grain sizes. Channel and source/drain regions are formed within the recrystallized amorphous silicon layer to complete formation of the thin film transistor body. An insulating layer is deposited over the thin film transistor body and the silicon substrate. Contact openings are made through the insulating layer to the source/drain regions and filled with a conductive material to complete the contacts completing the formation of the thin film transistor integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1A:
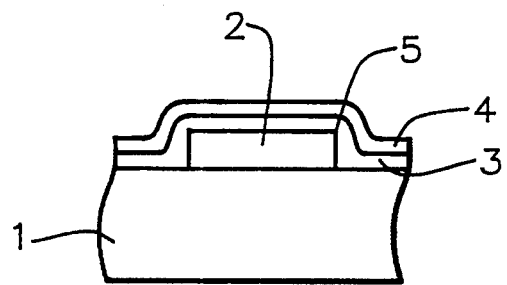
FIG. 1A schematically illustrates in cross-sectional representation a polysilicon profile of the prior art process.
Figure 1B:
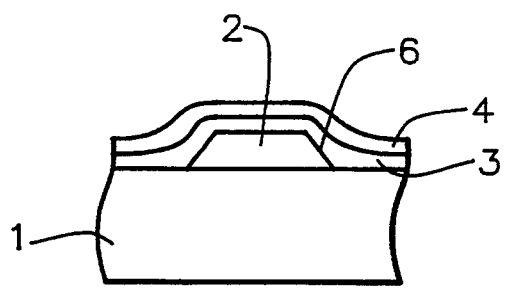
FIG. 1B schematically illustrates in cross-sectional representation a tapered polysilicon profile of the present invention.
Figure 2:
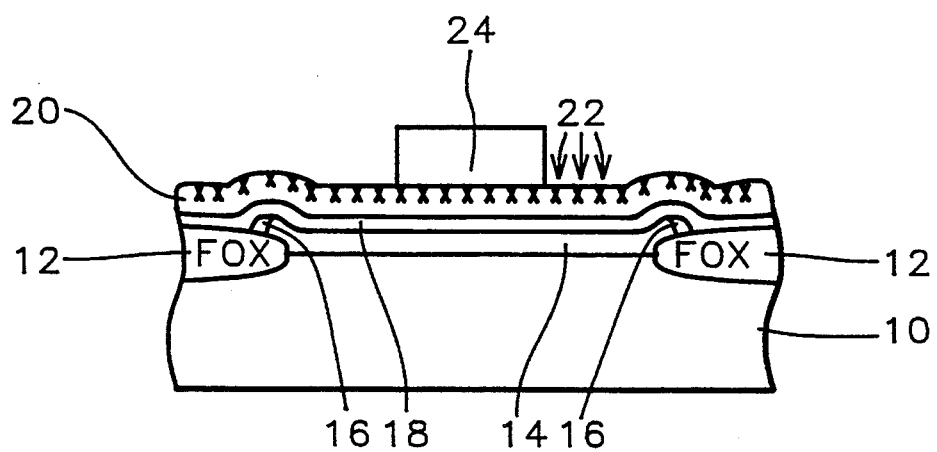
FIGS. 2 through 5 schematically illustrate in cross-sectional representation a preferred embodiment of the present invention.

Referring now more particularly to FIG. 2, there is shown a portion of a partially completed integrated circuit. The semiconductor substrate 10 is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 12. Then semiconductor devices can be provided in the silicon mesas according to the following processes.

A first layer of polysilicon 14 is deposited over the surfaces of the substrate and the field oxide 12 regions to a thickness of between about 2500 to 4000 Angstroms. The polysilicon layer 14 is patterned to form a gate for a typical transistor. A spacer silicon oxide layer is deposited and etched away to leave spacers 16 on the sidewalls of gate electrode 14. A layer of interpoly oxide 18 is deposited over gate 14 by low pressure chemical vapor deposition (LPCVD) using tetraethoxysilane (TEOS) to a thickness of between about 1000 to 2000 Angstroms. A second layer of polysilicon 20 is deposited over the interpoly oxide layer to a thickness of between about 200 to 550 Angstroms. This will form the tapered bottom gate of the thin film transistor (TFT).

The polysilicon layer 20 is doped by implantation of ions, such as arsenic, phosphorus, boron, or $BF_2$. The ions 22 are implanted into the polysilicon layer with a dosage of between about 1 E 15 to 3 E 15 atoms/cm$^2$ at an energy of between about 10 to 30 KeV. The implantation energy is adjusted to locate the projected depth of the ions at the upper half of the polysilicon layer. For example, an energy of 30 KeV is associated with a projected depth of 215 Angstroms with a standard deviation of 80 Angstroms. An energy of 20 KeV is associated with a projected depth of 159 Angstroms with a standard deviation of 59 Angstroms. The preferred dosage is chosen to achieve a sheet resistance of between about 200 to 1000 ohms/square.

Figure 3:
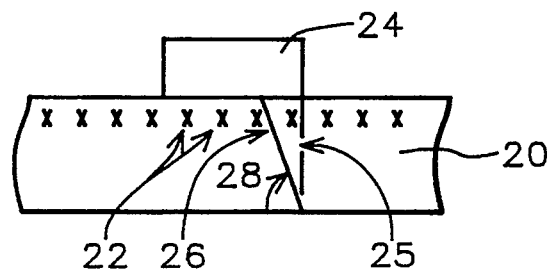

A photoresist layer is patterned to provide a mask 24 over the planned tapered gate. The polysilicon layer 20 is etched using, for example, one of the Rainbow 4400 family etchers made by LAM Research Corporation, San Jose, CA. First, an anisotropic etch is performed with endpoint detection. Next, there is a 100-180 % overetch to insure that no residue remains. Finally, an isotropic etch is used to taper the polysilicon layer. FIG. 3 illustrates a close up view of the polysilicon layer 20 under the photoresist mask 24. Dotted line 25 indicates the sidewall of the gate that would have been created if no ions had been implanted into the polysilicon. The highly damaged upper portion 22 of the polysilicon layer 20 will be etched faster than will the undamaged lower portion. This results in a tapered profile 26 since the damage to the layer decreases with depth. The angle of profile 28 will be between about 65° to 85°.

Figure 4:
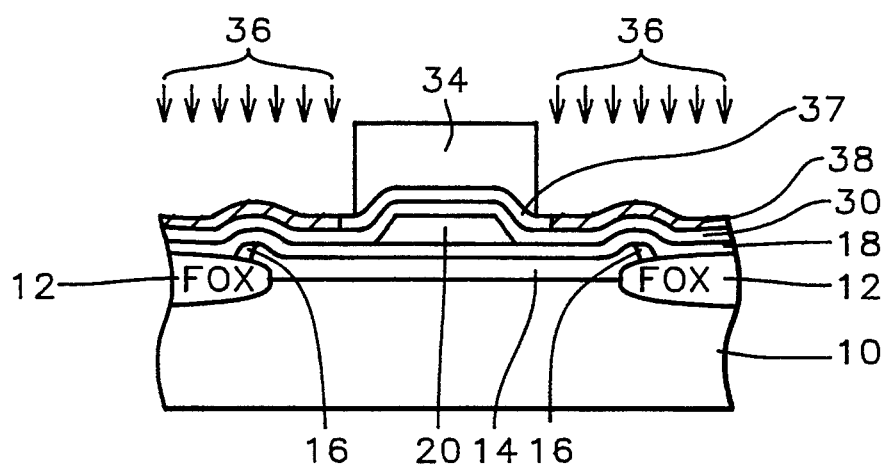

Referring now to FIG. 4, the photoresist mask 24 is removed followed by deposition of the TFT gate oxide. The tapered polysilicon profile 20 allows for a more uniform deposition of this gate oxide layer. The gate oxide is deposited evenly on the tapered edges without the step coverage problem which would occur over vertical sidewalls wherein the gate oxide would be thinner on the sidewall edge than on the top of the polysilicon gate. A LPCVD deposition with TEOS as a reactant deposits silicon dioxide 30 at a temperature of between about 680° to 750° C. to a thickness of between about 200 to 500 Angstroms, according to the specification of the product. High temperature oxide (HTO) LPCVD using $N_2O$ and $SiH_4$ or $SiCl_2H_4$ at a temperature of between about 780° to 850° C. and preferably about 800° to 820° C. is preferred over the TEOS deposition to yield a better quality gate oxide for the TFT.

Now the TFT body is to be formed. A LPCVD with $SIH_4$ or $Si_2H_6$ as source gases deposits a layer of amorphous silicon 32 at a temperature of between about 450° to 560° C. The thickness of this layer is between about 200 to 1000 Angstroms, depending on the process and electrical specifications. The amorphous silicon layer 32 is recrystallized to yield larger and more uniform grain size. Annealing in a nitrogen ambient at a temperature of between more than about 600° C. for about 10 to 48 hours causes the amorphous silicon to recrystallize as polysilicon with a grain size of between about 0.3 to 4.5 micrometers. Larger grain sizes are desirable because grain boundaries provide a high trapping center for carriers.

A photoresist mask 34 is patterned and used to shield the TFT channel region 37 during TFT source/drain implantation 36. $BF_2$ ions are implanted at a dosage of between about 2 E 14 to 5 E 15 atoms/cm$^2$ at an energy of between about 10 to 30 KeV. All portions of layer 32 not shielded by photoresist mask 34 become source/drain regions 38 surrounding TFT channel region 37. This completes formation of the thin film transistor (TFT) body.

Figure 5:
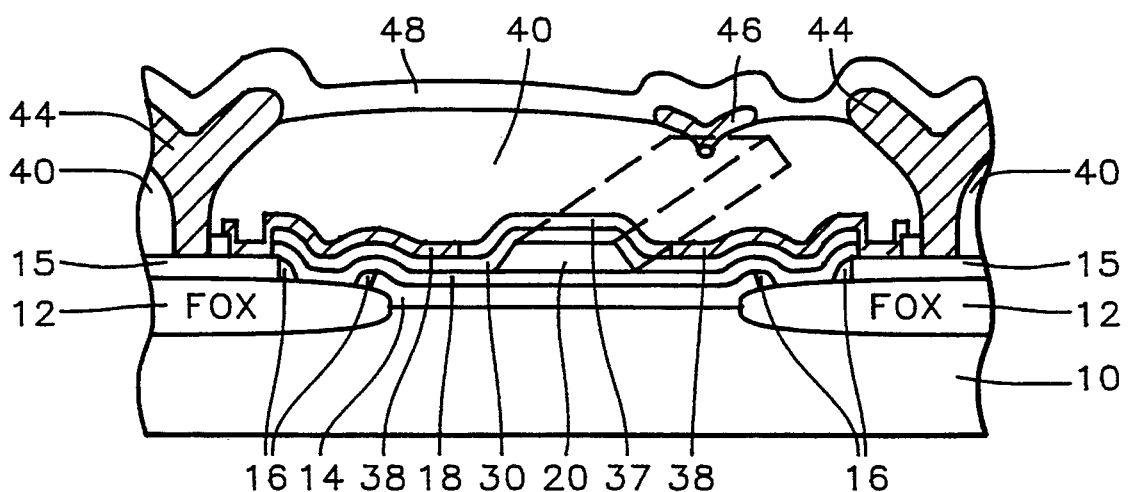

Standard CMOS backend processing is performed, including dielectric layer and metallization passivation to complete electrical connections within the device. FIG. 5 illustrates a portion of a completed TFT CMOS device. Dielectric layer 40 is composed of a layer of silicon oxide with a thickness of between about 900 to 1100 Angstroms and a layer of borophosphosilicate glass (BPSG) with a thickness of between about 3500 to 4500 Angstroms. Contact openings are made through the dielectric layer 40 to the source/drain areas of both the TFT and the typical MOSFETs and to the polysilicon gate 20. Metallization 44, such as aluminum alloyed with heavy metals, completes the source/drain contacts. Polysilicon pads 15 serve as etching buffers and act to complete the contact between metallization 44 and the TFT source/drain regions 38. The TFT source/drain regions 38 are too thin to allow a direct contact. Metallization 46 is the TFT bottom gate 20 contact which is also made through a polysilicon pad 15. Passivation layer 48 completes fabrication of the TFT integrated circuit.

The tapered polysilicon profile process of the present invention improves step coverage and the quality of the deposited gate oxide around the polysilicon edges. This leads to improved device performance and reliability.

While the invention has been particularly shown and described with reference to the preferred embodiments thereof, it will be understood by those skilled in the art that various changes in form and details may be made without departing from the spirit and scope of the invention.

What is claimed is:

1. The method of forming a thin film transistor integrated circuit with a tapered polysilicon profile comprising:

depositing a layer of polysilicon over the surface of a semiconductor substrate;

implanting ions into said polysilicon layer whereby the upper half of said polysilicon layer is damaged by the presence of said ions within said layer;

anisotropically etching said polysilicon layer;

isotropically etching said damaged portion of said polysilicon layer whereby said polysilicon layer is uniformly tapered;

depositing a layer of gate oxide over the surface of said uniformly tapered polysilicon layer;

forming a thin film transistor body comprising:

depositing a layer of amorphous silicon over the surface of said gate oxide layer;

covering said amorphous silicon layer overlying said uniformly tapered polysilicon layer with a photoresist mask wherein said covered portion of said amorphous silicon layer forms the channel of said thin film transistor body; and implanting ions into said amorphous silicon layer not covered by said photoresist mask to form source/drain regions within said amorphous silicon layer to complete formation of said thin film transistor body;

depositing an insulating layer over said thin film transistor body and said semiconductor substrate;

opening contacts through said insulating layer to said source/drain regions; and filling said contact openings with a conductive material to complete said contacts in the formation of said thin film transistor integrated circuit.

2. The method of claim 1 wherein said polysilicon layer is deposited to a thickness of between about 200 to 550 Angstroms.

3. The method of claim i wherein said ions implanted into said polysilicon layer are arsenic ions with a dosage of between about 1 E 15 to 3 E 15 atoms/cm$^2$ and energy of between about 10 to 30 KeV wherein said energy is adjusted so that the projected depth of said ions is within said upper half of said polysilicon layer.

4. The method of claim 1 wherein said ions implanted into said polysilicon layer are boron ions with a dosage of between about 1 E 15 to 3 E 15 atoms/cm$^2$ and energy of between about 10 to 30 KeV wherein said energy is adjusted so that the projected depth of said ions is within said upper half of said polysilicon layer.

5. The method of claim 1 wherein said anisotropic etch of said polysilicon layer is performed with endpoint detection followed by an overetch of between about 100 to 180%.

6. The method of claim 1 wherein said isotropic etch tapers said polysilicon layer wherein said damaged upper half of said polysilicon layer is etched away at a faster rate than the undamaged lower half of said layer and wherein the angle of said tapered polysilicon layer is between about 65° to 85°.

7. The method of claim 1 wherein said gate oxide layer is composed of silicon oxide deposited by low pressure chemical vapor deposition (LPCVD) at a temperature of between about 780° to 850° C. to a thickness of between about 200 to 500 Angstroms.

8. The method of claim 1 wherein said gate oxide layer is composed of tetraethoxysilane (TEOS) silicon dioxide deposited by low pressure chemical vapor deposition (LPCVD) at a temperature of between about 680° to 750° C. to a thickness of between about 200 to 500 Angstroms.

9. The method of claim 1 wherein said amorphous silicon layer is deposited using LPCVD using SiH$_4$ source gas at a temperature of between about 450° to 560° C. to a thickness of between about 200 to 1000 Angstroms and wherein said amorphous silicon layer is crystallized.

10. The method of claim 1 wherein said amorphous silicon layer is deposited using LPCVD using Si$_2$H$_6$ source gas at a temperature of between about 450° to 560° C. to a thickness of between about 200 to 1000 Angstroms and wherein said amorphous silicon layer is crystallized.

11. The method of forming a thin film transistor integrated circuit with a tapered polysilicon profile comprising:

depositing a layer of polysilicon over the surface of a semiconductor substrate;
implanting ions into said polysilicon layer whereby the upper half of said polysilicon layer is damaged by the presence of said ions within said layer;
anisotropically etching said polysilicon layer;
isotropically etching said damaged portion of said polysilicon layer whereby said polysilicon layer is uniformly tapered;
depositing a layer of gate oxide over the surface of said uniformly tapered polysilicon layer;
forming a thin film transistor body overlying said gate oxide layer wherein said forming said thin film transistor body comprises the steps of:

depositing a layer of amorphous silicon over the surface of said gate oxide layer;
crystallizing said amorphous silicon layer to yield uniform grain sizes;
covering said crystallized amorphous silicon layer overlying said uniformly tapered polysilicon layer with a photoresist mask wherein said covered portion of said crystallized amorphous silicon layer forms the channel of said thin film transistor body; and
implanting ions into said crystallized amorphous silicon layer not covered by said photoresist mask to form source/drain regions within said amorphous silicon layer to complete formation of said thin film transistor body;
depositing an insulating layer over said thin film transistor body and said semiconductor substrate;
opening contacts through said insulating layer to source/drain regions within said thin film transistor body; and
filling said contact openings with a conductive material to complete said contacts in the formation of said thin film transistor integrated circuit.

12. The method of claim 11 wherein said polysilicon layer is deposited to a thickness of between about 200 to 550 Angstroms.

13. The method of claim 11 wherein said ions implanted into said polysilicon layer are arsenic ions with a dosage of between about 1 E 15 to 3 E 15 atoms/cm$^2$ and energy of between about 10 to 30 KeV wherein said energy is adjusted so that the projected depth of said ions is within said upper half of said polysilicon layer.

14. The method of claim 11 wherein said ions implanted into said polysilicon layer are boron ions with a dosage of between about 1 E 15 to 3 E 15 atoms/cm$^2$ and energy of between about 10 to 30 KeV wherein said energy is adjusted so that the projected depth of said ions is within said upper half of said polysilicon layer.

15. The method of claim 11 wherein said anisotropic etch of said polysilicon layer is performed with endpoint detection followed by an overetch of between about 100 to 180%.

16. The method of claim 11 wherein said isotropic etch tapers said polysilicon layer wherein said damaged upper half of said polysilicon layer is etched away at a faster rate than the undamaged lower half of said layer and wherein the angle of said tapered polysilicon layer is between about 65° to 85°.

17. The method of claim 11 wherein said gate oxide layer is composed of high temperature oxide (HTO) deposited by low pressure chemical vapor deposition (LPCVD) at a temperature of between about 780° to 850° C. to a thickness of between about 200 to 500 Angstroms.

18. The method of claim 11 wherein said gate oxide layer is composed of tetraethoxysilane (TEOS) silicon dioxide deposited by low pressure chemical vapor deposition (LPCVD) at a temperature of between about 680° to 750° C. to a thickness of between about 200 to 500 Angstroms.

19. The method of claim 11 wherein said amorphous silicon layer is deposited using LPCVD using SiH$_4$ source gas at a temperature of between about 450° to 560° C. to a thickness of between about 200 to 1000 Angstroms.

20. The method of claim 11 wherein said amorphous silicon layer is deposited using LPCVD using Si$_2$H$_6$ source gas at a temperature of between about 450° to 560° C. to a thickness of between about 200 to 1000 Angstroms.

* * * * *